United States Patent [19]

Sezi et al.

[11] Patent Number: 5,688,631
[45] Date of Patent: Nov. 18, 1997

[54] METHODS FOR PRODUCING POLYBENZOXAZOL PRECURSORS AND CORRESPONDING RESIST SOLUTIONS

[75] Inventors: Recai Sezi; Hellmut Ahne, both of Roettenbach; Eva Rissel, Forchheim, all of Germany

[73] Assignee: Siemens Aktiengesellschaft, München, Germany

[21] Appl. No.: 618,488

[22] Filed: Mar. 19, 1996

[30] Foreign Application Priority Data

Mar. 23, 1995 [DE] Germany ............... 19510538.9
Mar. 23, 1995 [DE] Germany ............... 195105636.2

[51] Int. Cl.$^6$ ................................................ G03C 1/492
[52] U.S. Cl. .................. 430/270.1; 528/149; 528/182; 528/183; 528/482
[58] Field of Search .................... 528/149, 182, 528/183; 430/270.1

[56] References Cited

U.S. PATENT DOCUMENTS

| | | | |
|---|---|---|---|
| 3,094,511 | 6/1963 | Hill, Jr. et al. | 528/183 |
| 4,332,883 | 6/1982 | Ahne et al. | 430/270.1 |
| 4,339,521 | 7/1982 | Ahne et al. | 430/192 |
| 5,021,320 | 6/1991 | Mueller et al. | 430/192 |
| 5,104,768 | 4/1992 | Sassmannhausen | 430/906 |
| 5,391,465 | 2/1995 | Feely | 430/270.1 |

*Primary Examiner*—Peter F. Kulkosky
*Attorney, Agent, or Firm*—Kenyon & Kenyon

[57] ABSTRACT

Methods for producing solutions of polybenzoxazol precursors that are soluble in alkali and resist solutions based on such precursors. A dicarboxylic acid halogenide is reacted with a bis-(o-aminophenol) in an organic solvent and in the presence of a polymer with a tertiary N atom, which is insoluble in the solvent. Excess polymer and hydrohalogenide are separated from the reaction solution. The reaction solution is optionally mixed with a photoactive component.

9 Claims, No Drawings

METHODS FOR PRODUCING POLYBENZOXAZOL PRECURSORS AND CORRESPONDING RESIST SOLUTIONS

FIELD OF INVENTION

The present invention relates to methods for producing solutions of polybenzoxazol precursors that are soluble in alkali and resist solutions based on such precursors.

BACKGROUND OF THE INVENTION

In microelectronics, highly heat-resistant polymers are needed, particularly as insulating layers and dielectrics. Examples of such polymers are polyimides (PI) and polybenzoxazols (PBO). Precursors of these polymers can be modified to be photoreactive and directly structured using photochemical processes. The precursors, also referred to as prepolymers herein, are converted to the corresponding polymer (PI or PBO) under appropriate temperature conditions. The polymers can, also be structured indirectly using resists.

In microelectronics, highly heat-resistant photoresists are particularly useful for the direct production of structured insulating layers and dielectrics. Such photoresists generally contain a base resin and a photoactive component (PAC). Diazoketones, and especially quinone diazides, commonly are used as the photoactive component and precursors of polyimides and polybenzoxazols typically serve as the base resin.

These precursors are converted thermally to the corresponding polymer (PI or PBO) after photostructuring. The structures produced are protected from being deformed or decomposed at high temperatures which could occur during further processing or during the lifetime of the electronic component.

Photosensitive PBO precursors, in contrast to most PI precursors, offer the advantage of structurability in the positive mode and the possibility of development with an aqueous-alkaline medium (see EP-PS 0 023 662 and EP-OS 0 264 678 in this regard). A significant advantage of the positive structurability is the lesser defect density in structuring the so-called "via holes," because, in contrast to systems which operate in the negative mode, only a fraction of the surface is exposed.

PBO prepolymers suitable for directly structuring must not only be soluble in alkali, but also soluble in organic solvents, so that they can be applied to a substrate in the desired concentration and in a solution form using spin-coating or spraying techniques.

The most common method for producing PBO prepolymers that are soluble in alkali, for example as the base resin for highly heat-resistant photoresists, is the conversion of a dicarboxylic acid chloride with a suitable bis-(o-aminophenol). To capture the hydrogen chloride (HCl) which is formed during the reaction, a soluble base compound, such as pyridine or triethylamine, is generally added (see EP-OS 0 264 678 and EP-PS 0 291 779). The chloride remaining in the PBO precursor, as well as other ions, must be removed by an ion exchanger if they impair the function of the microelectronic components over time.

After the reaction is complete, the PBO precursor must be precipitated in a suitable precipitant to remove impurities, washed, and dried. In order to obtain a prepolymer solution in useable form, the PBO precursor is subsequently dissolved in a suitable solvent, together with additives if necessary, and then pressure-filtered. The method for producing ready-to-use resist solutions is similar, except that the PBO precursor is dissolved together with the photoactive component. For pressure filtration, membrane filters with a pore size of approximately 0.2 to 1 µm are generally used. Pressure filtration (otherwise known as microfiltration) is necessary in microelectronic applications because defects can result if foreign particles, such as dust, remain either in the solution or in the prepolymer or resist film which is formed after spin-coating or spraying. Such defects significantly impair the function of this layer. For this reasons all commercially available (photosensitive) dielectrics and resists based on polyimide, for example, are offered in filtered form.

Microfiltration of the prepolymer or resist solution can cause problems if the solution to be filtered contains particles or molecules of the PBO precursor which do not pass through the pores of the microfilter at all, or pass through only with great difficulty. The formation of such particles is due to the method by which the precursor is synthesized. The filterability of the resist solution can also be affected by interactions between the photoactive component and the base resin.

As mentioned above, PBO prepolymers are produced by reacting a dicarboxylic acid chloride with a bis-(o-aminophenol). Since acid chlorides react with both amino groups (forming amides) and hydroxyl groups (forming esters), and bis-(o-aminophenols) have two amino functional groups and two hydroxy functional groups, all four groups on the bis-(o-aminophenols) can react with the acid chloride resulting in partial cross-linking, i.e., gel formation. Such cross-linking causes poor filterability of the solution. Unfortunately, the formation of very small gel particles usually is not discovered until the ready-to-use solution is subjected to microfiltration through filters with a pore size $\leq 1$ µm. In rare instances, the poor filterability is evident during filtration of the precipitated PBO precursor after the condensation reaction. This is because the filters used at that stage, e.g., folded filters, generally have a significantly greater pore size.

If the prepolymer or resist solution contains a certain amount of such gel-like particles, the microfiltration step can require multiple filter replacements and, thus, can be time consuming and labor intensive to complete. In addition, each filter change represents a loss of product. Since these disruptions cannot be completely avoided using current production processes, individual batches are frequently discarded because they are almost impossible to filter. In view of the high material costs, this is a great disadvantage of prior art processes.

Furthermore, cost-intensive steps, such as precipitation, washing and drying of the precursor, are undesirable and prevent cost-effective production. For example, 6 to 10 times the amount of precipitant, as compared to the reaction solution volume, is generally required for precipitation. Disposal of the contaminated precipitant, is another disadvantage, not only in terms of costs, but also for reasons of environmental protection. The same holds true for drying the polymer precursors.

For ready-to-use resist solutions, it is also important that the base compounds used in the synthesis of the prepolymers, such as pyridine and triethylamine, are not present even in the smallest amounts. This is because any base residues which remain in the solution will destroy the photoactive components which are largely based on quinone diazides.

While PBO polymers are useful as protective coatings or layers in the field of microelectronics, their utility is not restricted to microelectronics. Depending on the quality of the PBO precursor solutions following filtration, i.e., by microfiltration, PBO polymers can also be used in membrane technology, and particularly, in the separation of gases.

OBJECTS AND SUMMARY OF THE INVENTION

It is an object of the present invention to provide a cost-effective method for producing solutions of polybenzoxazol precursors, or resist solutions based on such precursors, which solutions are capable of being filtered without requiring multiple filter replacements.

It is a further object to provide a method for producing solutions of polybenzoxazol precursors, or resist solutions based on such precursors, which solutions do not contain gel-like particles that can impede filtration.

It is another object to provide a method for producing solutions of polybenzoxazol precursors, or resist solutions based on such precursors, which requires minimal precipitant and, thus, produces minimal waste.

It is yet another object to provide a method for producing resist solutions based on polybenzoxazol precursors which solutions do not contain any residues of the base compounds used in the synthesis of the prepolymers that can destroy photoactive components.

The present invention provides a method for producing solutions of polybenzoxazol precursors by reacting a dicarboxylic acid halogenide with a bis-(o-aminophenol) in an organic solvent, in the presence of a polymer with a tertiary N atom which is insoluble in the solvent. The excess polymer and its hydrohalogenide are separated from the reaction solution. According to one embodiment of the invention, the reaction solution is mixed with a photoactive component to form a resist solution.

DETAILED DESCRIPTION OF THE INVENTION

The present invention is directed to methods for producing solutions of polybenzoxazol precursors by reacting a dicarboxylic acid halogenide with a bis-(o-aminophenol) in an organic solvent.

According to the invention, the acid which is formed during the conversion between the dicarboxylic acid halogenide and the bis-(o-aminophenol), such as hydrogen chloride, is captured and bound, for example as hydrochloride, not using a soluble base, such as pyridine and triethylamine, but, rather, using a solid polymer having a tertiary nitrogen atom which is completely insoluble in the reaction medium or solvent. Prepolymer solutions or resist solutions, which also contain a photoactive component, made in such manner surprisingly can be filtered without problems.

The polymer is preferably a vinyl pyridine polymer, and more particularly, cross-linked poly-(4-vinyl pyridine). In addition, the following compounds may also be used, alone or in combination, as acid capturing agents: polymers of acryl, methacryl, allyl and vinyl compounds with a tertiary nitrogen atom, where at least one of the monomers has a N atom in the case of copolymers and terpolymers.

Generally, common compounds are used as the solvent, the dicarboxylic acid halogenide and the bis-(o-aminophenol), with N-methyl pyrrolidone being preferred (as the solvent). Preferably a dicarboxylic acid chloride is used as the dicarboxylic acid derivative, and a 2,2-bis(3-amino-4-hydroxy phenyl) propane is used as the bis-(o-aminophenol). The photoactive component is generally also a common compound, and, preferably, a quinone diazide.

In the method according to the invention, the hydrohalogenide of the polymer used, as well as any excess polymer, is removed after synthesis of the polymer, generally using known filtration processes, for example, by using a folded filter. The reaction solution obtained can be purified using an ion exchanger, before it is processed further or mixed with the photoreactive component. Before use, or after addition of the photoactive component, the solution is filtered through a membrane filter, e.g., a filter having a pore width of about 0.2 to 0.5 µm, which filtration is possible without problems; it is then ready for use.

A ready-to-use solution can also be produced by precipitating the prepolymer from the reaction solution, drying it, and, if necessary, mixing it with a photoactive component. The prepolymer is then dissolved again in a suitable solvent. Microfiltration of such a solution proceeds quickly and without problems. Furthermore, the solutions of the polymer precursors or the resist solutions can be concentrated.

The filtered prepolymer or resist solution can be directly applied to the substrate to be insulated or protected, for example, by spin-coating. After a uniform film is formed by drying, for example, on a hot plate at 100° to 130° C., it is given its characteristic properties by tempering at 300° to 450° C. Tempering the film converts the prepolymer into polybenzoxazol. If the film is not tempered, but, rather, only dried, it becomes soluble in aqueous-alkaline developers which are free of metal ions. The film is, thus, useful as a base resin for insulating layers that work in a positive mode and that are capable of being photostructured. In the case of a resist solution, the uniform resist film which is formed is structured photolithographically after drying, for example, on a hot plate at 100° to 130° C. The structured film is given its final properties by tempering at 300° to 450° C., which causes the prepolymer to be converted to polybenzoxazol.

The method according to the invention is particularly suitable for the production of prepolymer or resist solutions which are needed in microelectronics for the production of insulating layers and dielectrics, photosensitive ones if necessary. A particularly economically and environmentally relevant advantage is that expensive work steps, such as precipitation and drying of the PBO prepolymer, as well as disposal of a precipitant, can be eliminated.

The invention will be explained in greater detail on the basis of the following examples.

EXAMPLE 1

Production of a prepolymer solution and a resist solution 21 g of dry cross-linked poly-(4-vinyl pyridine) and 21.96 g of 1,1,1,3,3,3-hexafluoro-2,2-bis-(3-amino-4-hydroxy phenyl) propane (0.06 mole) are placed in a dry reaction vessel under nitrogen. The bisaminophenol is dissolved by adding 198 g dry N-methyl pyrrolidone (NMP) (while stirring). Subsequently, the reaction vessel is cooled until the temperature of the solution has reached −10° C. Then 14.75 g of diphenyl ether-4,4'-dicarboxylic acid dichloride (0.05 mole), dissolved in 133 g of dry N-methyl pyrrolidone, are slowly dripped into the bisaminophenol solution. After the addition is complete, stirring continues for another hour at −10° C., then cooling is removed and the reaction solution is stirred for about 18 to 20 h. Subsequently, 3.28 g of norbornene anhydride (0.02 mole), dissolved in 30 g dry N-methyl pyrrolidone, are dripped in at 5° C. Stirring continues for approximately another 18 to 20 hours, at room temperature. The solution of the PBO prepolymer obtained in this way is filtered using a folded filter to separate the poly-(4-vinyl pyridine) and the hydrochloride.

0.5 g of a diester of bisphenol A and naphthoquinone diazide-4-sulfonic acid as the photoactive component are completely dissolved in 22 g of the reaction solution. This resist solution is stored in a brown bottle.

EXAMPLE 2

Film formation 18 ml of the prepolymer solution or the resist solution according to Example 1 are drawn into a 20 ml syringe, which is then provided with a filter (0.2 μm). 2 ml of the solution in each instance are applied to a cleaned and dried silicon wafer through the filter; the filtration proceeds easily and without problems. The wafer is uniformly coated with the solution by spin-coating. After drying on a hot plate at 120° C., the film formed is tempered in a tempering oven at 350° C., under nitrogen. A uniform, highly heat-resistant protective layer is obtained.

EXAMPLE 3

Solubility in alkaline developers

Another 2 ml of the prepolymer solution are applied to a cleaned silicon wafer through the filter, in accordance with Example 2, and dried on a hot plate at 120° C. Subsequently, the uniform film formed is brought into contact with a commercial aqueous-alkaline developer (NSD-TD, Tokyo Ohka). A continuous and uniform resolution of the film in the developer is obtained.

EXAMPLE 4

Photostructuring

Another 2 ml of the resist solution are applied to a cleaned silicon wafer through the filter, in accordance with Example 2, and dried on a hot plate at 120° C. Subsequently, the uniform film formed is contact-exposed using a test mask (broad-band exposure with the MA 56M, Karl Süss). Then the exposed regions are dissolved out with a commercial aqueous-alkaline developer (NSD-TD, Tokyo Ohka), then the wafer is rinsed with water and dried on a hot plate at 90° C. Positive structures with a good quality are obtained.

EXAMPLE 5

Microfiltration

The remaining amount of prepolymer solution or resist solution (14 ml in each instance) is filtered into a vessel through the filter. Filtration continues to proceed easily and without problems.

EXAMPLE 6

Production of solutions with precipitated PBO prepolymer

A prepolymer solution or a reaction solution according to Example 1 is mixed with ten times its volume of a mixture of isopropanol and water (precipitant), with the PBO prepolymer being precipitated. The prepolymer is then drawn off via a paper filter, washed four times with additional precipitants, placed in a glass bowl and dried to weight constancy at 50° C., in a vacuum.

A 30% solution in N-methyl pyrrolidone is produced from the dried PBO prepolymer to form a prepolymer solution. In experiments according to Examples 2, 3 and 5, it is found that the film quality (after drying and tempering) as well as the solubility in alkali are perfect and that filtration proceeds without problems.

A resist solution is produced from 6 g of the dried prepolymer, 1.5 g of the photoactive component (see Example 1) and 17.5 g dry N-methyl pyrrolidone. In experiments according to Examples 2, 4 and 5, it has been found that the film quality (after drying and tempering) as well as the photostructurability are perfect and that filtration proceeds without problems.

EXAMPLE 7

Production of a prepolymer solution and a resist solution 17 g dry cross-linked poly-(4-vinyl pyridine) and 18.3 g 1,1,1,3,3,3-hexafluoro-2,2-bis-(3-amino-4-hydroxy phenyl) propane (0.05 mole) are placed in a dry reaction vessel under nitrogen. The bisaminophenol is dissolved by adding 165 g dry N-methyl pyrrolidone (NMP) (while stirring), subsequently the reaction vessel is cooled until the temperature of the solution has reached −10° C. Then 11.8 g diphenyl ether-4,4'-dicarboxylic acid dichloride (0.04 mole), dissolved in 106 g dry N-methyl pyrrolidone, are slowly dripped into the bisaminophenol solution. After the addition is complete, stirring continues for another hour at −10° C., then cooling is removed and the reaction solution is stirred for about 18 to 20 h. Subsequently, 3.28 g norbornene anhydride (0.02 mole), dissolved in 30 g dry N-methyl pyrrolidone, are dripped in at 5° C., and then stirring continues for another approximately 18 to 20 h, at room temperature. The solution of the PBO prepolymer obtained in this way is filtered via a folded filter to separate the poly-(4-vinyl pyridine) and the hydrochloride. Subsequently, the reaction solution is purified first with a commercial anion exchanger (ion exchanger ITI, Merck) and then with a commercial cation exchanger (Amberlyst 15, Merck).

The reaction solution obtained in the manner described is mixed with ten times its volume of a mixture of isopropanol and water (precipitant), with the PBO prepolymer being precipitated. The prepolymer is then drawn off via a paper filter, washed four times with additional precipitants, placed in a glass bowl and dried to weight constancy at 50° C., in a vacuum.

A 30% solution in N-methyl pyrrolidone is produced from the dried PBO prepolymer. In experiments according to Examples 2, 3 and 5, it is found that the film quality (after drying and tempering) as well as the solubility in alkali are perfect and that filtration proceeds without problems.

A resist solution is produced from 6 g of the dried prepolymer, 1.5 g of the photoactive component (see Example 1) and 17.5 g dry N-methyl pyrrolidone. In experiments according to Examples 2, 4 and 5, it has been found that the film quality (after drying and tempering) as well as the photostructurability are perfect and that filtration proceeds without problems.

EXAMPLE 8

Production of a prepolymer solution and a resist solution (comparison tests)

A PBO prepolymer is produced according to Example 6, with the exception that instead of poly-(4-vinyl pyridine), 12.64 g dry pyridine (0.16 mole) are used as the acid capturing agent; the amount ratios of the remaining components remain unchanged. To separate the pyridine or pyridine hydrochloride, the solution of the prepolymer obtained is mixed with ten times its volume of a mixture of isopropanol and water (precipitant), with the PBO prepolymer being precipitated. The prepolymer is then drawn off via a paper filter, washed four times with additional precipitants, placed in a glass bowl and dried to a constant weight at 50° C. in a vacuum.

A 30% solution in N-methyl pyrrolidone is produced from the dried PBO prepolymer. In experiments according to Examples 2, 3 and 5, it has been found that while the film quality (after drying and tempering) as well as the solubility in alkali are good, filterability is clearly worse than with the polymer solution according to the invention. Filtration becomes clearly more difficult after only the first 4 to 5 ml; after filtration of approximately 8 ml of the solution, the remaining amount can no longer be filtered.

A resist solution is produced from 6 g of the dried prepolymer, 1.5 g of the photoactive component (see Example 1) and 17.5 g dry N-methyl pyrrolidone. In experiments according to Examples 2, 4 and 5, it is found that while the film quality (after drying and tempering) as well as the photostructurability are good, filterability is clearly worse than with the resist solution according to the invention. Filtration becomes clearly more difficult after only the first 4 to 5 ml; after filtration of approximately 9 ml of the solution, the remaining amount can no longer be filtered.

As will be apparent to those skilled in the art, the present invention may be embodied in other forms or carried out in other ways without departing from the spirit or essential characteristics of the invention.

What is claimed is:

1. A method for producing a solution of polybenzoxazol precursors soluble in alkali, comprising:

reacting a dicarboxylic acid halogenide with a bis-(o-aminophenol) in an organic solvent, in the presence of a polymer with a tertiary N atom which is insoluble in the solvent, the polymer being a vinyl pyridine, acryl, methacryl, allyl or vinyl homopolymer, copolymer or terpolymer; and separating excess polymer and hydrohalogenide from the reaction solution.

2. The method according to claim 1, wherein after separating the polymer and hydrohalogenide, the reaction solution is purified by ion exchange.

3. The method according to claim 1, wherein the polymer is a vinyl pyridine polymer.

4. The method according to claim 3, wherein the polymer is cross-linked poly-(4-vinyl pyridine).

5. The method according to claim 1, wherein the dicarboxylic acid halogenide is dicarboxylic acid chloride.

6. The method according to claim 1, wherein the bis-(o-aminophenol) is 2,2-bis-(3-amino-4-hydroxy phenyl) propane.

7. The method according to claim 1, wherein the solvent is N-methyl pyrrolidone.

8. A method for producing a resist solution of alkali soluble polybenzoxazol precursors according to claim 1, further comprising the step of:

mixing a photoactive component into the reaction solution.

9. The method according to claim 8, wherein the photoactive component is quinone diazide.

* * * * *